United States Patent [19]

Toyama et al.

[11] 4,063,507

[45] Dec. 20, 1977

[54] PROCESS FOR BURNING IN PLANOGRAPHIC PRINTING PLATES

[75] Inventors: Tadao Toyama; Masaru Watanabe; Harumasa Kitago, all of Shizuoka, Japan

[73] Assignee: Fuji Photo Film Co., Ltd., Minami-Ashigara, Japan

[21] Appl. No.: 692,396

[22] Filed: June 3, 1976

[30] Foreign Application Priority Data

June 4, 1975 Japan .................. 50-67180

[51] Int. Cl.² ............................ G03F 7/02; B41C 1/10
[52] U.S. Cl. ........................ 101/467; 96/33; 101/456
[58] Field of Search ............... 96/33; 101/454, 457, 101/462, 465, 466, 467, 456

[56] References Cited

U.S. PATENT DOCUMENTS

| 2,042,003 | 5/1936 | Huebner | 96/33 |
|---|---|---|---|
| 2,230,981 | 2/1941 | Toland et al. | 96/33 |
| 2,734,298 | 2/1956 | Molz et al. | 96/33 |
| 3,030,210 | 4/1962 | Chebiniak | 96/33 |
| 3,480,435 | 11/1969 | Toland et al. | 96/33 |
| 3,585,031 | 6/1971 | Hayes | 101/456 |
| 3,650,742 | 3/1972 | Etter et al. | 96/33 |
| 3,669,018 | 6/1972 | Wheelock | 96/33 |
| 3,756,823 | 9/1973 | Haaf et al. | 96/33 |

FOREIGN PATENT DOCUMENTS

| 955,687 | 4/1964 | United Kingdom | 96/33 |

*Primary Examiner*—Clyde I. Coughenour
*Attorney, Agent, or Firm*—Sughrue, Rothwell, Mion, Zinn and Macpeak

[57] ABSTRACT

A process for producing a planographic printing plate comprising subjecting a light-sensitive planographic printing plate member to a burning in wherein the light-sensitive planographic printing plate member is treated with a solution containing at least one compound selected from the group consisting of boric acid, or the metal salts or ammonium salt thereof, prior to the burning in.

9 Claims, No Drawings

PROCESS FOR BURNING IN PLANOGRAPHIC PRINTING PLATES

BACKGROUND OF THE INVENTION

1. Field of the Invention

The present invention relates to a process for producing planographic printing plates, more particularly, to a treatment for use in producing planographic printing plates comprising subjecting light-sensitive planographic printing plate members with metal as a support to a burning-in.

2. Description of the Prior Art

Planographic printing is a printing method utilizing the property that water and oil will not substantially mix. The surface of a printing plate consists of areas which will receive water and repel greasy ink and areas which will repel water and receive greasy ink. The former areas are non-image areas and the latter areas are image areas. Light-sensitive compositions, therefore, used in planographic printing members are required to have the property that after image formation they will repel water and receive greasy ink.

Light-sensitive compositions used in planographic printing plate members are divided into positive types and negative types, and, as positive type light-sensitive compositions, o-quinone diazide type light-sensitive materials are often used.

Positive type light-sensitive planographic printing plates are produced by coating an o-guinone diazide type light-sensitive material, alone or in combination with appropriate additives, on a support such as a metal, plastic, or the like. On exposing this light-sensitive printing plate to active rays through a transparent positive, the o-quinone diazide type light-sensitive material of the exposed areas decomposes and becomes alkali-soluble, and thus it is easily removed with an aqueous alkali solution, thereby providing a positive image.

In this case, where a support with a surface previously treated to render the same hydrophilic is used, the areas removed by an aqueous alkali solution expose the hydrophilic layer, which will receive water and repel ink. On the other hand, the areas remaining as an image are oleophilic and accept ink.

As negative type light-sensitive compositions, diazonium salts, azide compounds, or photopolymerizable compounds are often used. These light-sensitive materials are coated, alone or in combination with appropriate additives, on a support.

In this case, where a support with a surface previously treated to render the same hydrophilic is used, unexposed areas are removed with a developer, uncovering the hydrophilic layer which will receive water and repel ink. On the other hand, the areas which have hardened upon exposure to light and remain as an image at development are oleophilic and receive ink.

When printing is effected after mounting the above planographic printing plate on an offset printing machine, beautiful copies are obtained. With these printing plates, it is possible to produce several ten thousand beautiful prints by appropriately selecting the support and the light-sensitive layer to be coated on the support. In particular, the use as the support of an aluminum plate subjected to sand-graining and anodic oxidation provides beautiful prints of up to 100,000 copies.

However, it is sometimes desired that more than 100,000 copies be obtained using one printing plate.

For this purpose, a method can be effectively used which comprises heating the planographic printing plate comprising a metal plate of aluminum or zinc as the support by a conventional method at elevated temperatures after exposure and development of the printing plate member. This heating is generally called a burning-in is described in detail in British Pat. Nos. 1,151,199 and 1,154,749.

The application of a burning-in makes it possible to increase the number of copies obtained with one printing plate several times as many as in the case of no burning-in being applied.

With printing plates produced by conventional plate-making methods, when special printing inks containing many components capable of dissolving the image on the printing plate, such as an ultraviolet ray curable ink, a low temperature drying ink, etc., are used, the image areas of the printing plate are vigorously dissolved by these inks, resulting in a marked reduction in press life as compared to the case in which an ordinary ink is used. However, the application of a burning-in makes it possible to obtain a sufficient number of copies, even using the above special printing inks, because the solvent resistance of the image areas is markedly increased.

However, when the burning in is applied, the non-image areas of the printing plate which are hydrophilic prior to the burning in (i.e., areas where the hydrophilic surface of the support is exposed by development) lose their hydrophilicity and tend to receive printing ink, thereby causing contamination at the background of printed matter (background contamination). No burning-in effect, however, can be obtained unless heating is applied to the extent that the above background contamination takes place. After the burning-in, therefore, it is required that a surface smoothening treatment to restore hydrophilicity by cleaning the non-image areas be applied.

This surface smoothening treatment is achieved by eroding the metal surface of the support with an aqueous alkali or acid solution, thereby exposing a fresh, clean surface. The alkali or acid used is selected from those compounds capable of eroding the metal surface in a short period, and fluorides such as hydrofluoric acid, hydroborofluoric acid, hydrosilicofluoric acid, and the like are often used. These fluorides, however, are toxic, dangerous substances, and cause many pollution problems.

Moreover, since the application of the surface smoothening treatment erodes the metal surface of the support, and renders the surface easily scratchable and poorly durable to abrasion, it is likely that the non-image areas will lose the ability to accept water (water retention property), background contamination will occur, and the printing plate will not be durable to further printing.

SUMMARY OF THE INVENTION

Accordingly, one object of the present invention is to avoid the necessity of one using toxic fluorides in a surface smoothening solution after burning-in.

Another object of the present invention is to prevent background contamination caused by a burning-in without eroding the metal surface of the support (non-image areas) and without reducing the abrasion resistance and the water retention of non-image areas.

As a result of the inventors' research to attain the above objects, it has now been found that background contamination of non-image areas can be prevented by pre-treating the light-sensitive planographic printing plate member with a solution containing at least one compound selected from the group consisting of boric acid, or metal salts or the ammonium salt thereof, prior to the burning-in of the light-sensitive planographic printing plate member, and thus the present invention has been achieved.

DETAILED DESCRIPTION OF THE INVENTION

In accordance with the plate-making method of the present invention, even though printing is effected without applying a conventional surface smoothening treatment after the burning-in, no background contamination takes place and beautiful prints are obtained. Thus, the use of the fluorides used in conventional surface smoothing treatments is not necessary, which is very advantageous from the standpoint of preventing pollution. Moreover, since no erosion of the metal surface of the support by the surface smoothening treatment is caused, the metal surface is free from scratches and a reduction in abrasion resistance, and, furthermore, free from any problems during printing.

No attempts to prevent background contamination due to the burning-in by only such a pre-treatment have ever been made, and thus the method of the present invention is novel.

British Pat. No. 1,154,749 describes that it is advantageous to treat a printing plate member with a solution of acid in water, e.g., 0.5 to 3% phosphoric acid, prior to a burning-in, but it also describes that even through this kind of hydrophilization treatment is applied, it is necessary to apply a surface smoothening treatment after the burning-in. The inventors' research has revealed that pre-treatment using inorganic acids such as phosphoric acid, nitric acid, sulfuric acid, hydrochloric acid, and the like is not satisfactory for the plate making method of the present invention.

On the contrary, the pre-treatment of the present invention is very effective and unexpectedly makes it possible to prevent background contamination without any surface-smoothening treatment after a burning-in.

Furthermore, it has hitherto not been considered that compounds such as metal salts of boric acid, which exert no strong effect on aluminum or zinc, as is used as the support of the printing plate member, can be used as pre-treating agents to prevent background contamination due to a burning-in.

In a typical embodiment, the pre-treating agent of the present invention is merely coated on a printing plate at room temperature and at atmosphere pressure, and then dried. No substantial detrimental influence is exerted on the successful practice of the present invention by varying the coating temperature drying temperature or drying time. Good results are obtained when the pre-treating agents of the present invention are coated in a dry amount of about 10 mg/m$^2$ or more; typically, the minimal amount required to obtain acceptable results would be utilized in order to lower material costs. The minimal amount required can easily be determined by one skilled in the art by practicing few trail process runs.

Burning pre-treating agents used in the present invention include boric acid, metal salts of boric acid, with the alkali metal, alkaline earth metal and ammonium salts being preferred, e.g., sodium borate, potassium borate, lithium borate, and ammonium borate. These compounds exhibit substantially no effect as conventional surface-smoothening agents after a burning-in.

Those solutions prepared by dissolving the above compounds, alone or as a mixture comprising two or more thereof, in water can be used as the burning pre-treating agents of the present invention. The concentration of these compounds is from about 0.5% by weight to that of a supersaturated solution thereof, preferably from 3 to 10% by weight.

To the burning pre-treating agent of the present invention there can be added a suitable amount of organic or inorganic additives, if desired, for example, from 0 to 20 wt% based on the amount of boric acid and/or borate(s) present (summation of the weights thereof if boric acid is used in combination with one or more borates).

For instance, for coloring the burning pre-treating agents, water-soluble dyes such as Malachite Green, Safranine, Crystal Violet, and the like can be used, and as agents for increasing the viscosity of the treating solution, water soluble resins such as grum arabic, carboxymethyl cellulose, dextrin, and the like can be used.

The burning pre-treating agent of the present invention is applied after the light-sensitive planographic printing plate member has been developed and washed, and then, if desired, areas unnecessary for printing are removed with a modifying agent in a conventional manner until the printing plate not requiring any further correction is obtained.

The developing solution and developing conditions utilized are not overly important and, essentially, are selected from those conventionally used in the art. Typically, an aqueous alkali solution is used as a developing solution for a positive type photosensitive printing plate material comprising an o-quinone diazide photosensitive material. Examples of such aqueous alkali solutions include sodium silicate, potassium silicate, sodium hydroxide, potassium hydroxide, sodium phosphate and the like. On the other hand, developing solutions for negative-type photosensitive planorgraphic printing plates typically comprise an organic solvent, and numerous of such materials are available and will be appropriately correlatible with the plate by one skilled in the art.

As one method of applying the burning pre-treating agent, the surface of the printing plate is rubbed with a sponge or absorbent cotton soaked with the pre-treating agent to thereby coat it thereon, or the printing plate is dipped in a tray filled with the pre-treating agent to thereby coat it thereon, or a like method can be used. Rendering the coating amount of the pretreating agent smooth by, e.g., squeegeeing after the coating thereof, provides preferred results.

The printing plate is, after drying, heated at high temperatures by the use of a burning processor (e.g., Burning Processor 1300 produced by Fuji Photo Film Co., Ltd.). The burning-in time varies depending upon the burning-in temperature, for instance, at 230° C about 12 minutes is conveniently used, at 260° C about 7 minutes is conveniently used and at 300° C about 5 minutes is conveniently used; generally, the higher the temperature, the shorter the time which is required. Typically, temperatures of about 180° C to about 350° C are utilized. Preferred heating temperatures and times are 200° C to 300° C and about 3 to about 20 minutes, respectively, although they vary depending upon the kind of the resin forming the image. For all practical processings, the burning-in of the present invention will be conducted at atmospheric pressure.

The plates which can be processed in accordance with the present invention are not particularly limited, and useful resins include those conventionally used in the art, for example, novolak type phenol-formaldehyde resins, novolak type cresol-formaldehyde resins, resol type phenol-formaldehyde resins and epoxy resins. The support is conventionally aluminum, which includes aluminum alloys, though if desired zinc may be utilized.

The aluminum or aluminum alloys utilized are not particularly limited, and a variety of alloys can be used including those containing silicon, copper, manganese, magnesium, chromium, zinc, lead, bismuth, nickel, etc. Some representative examples of typical alloy compositions are shown in the following table. In the table, the values given are percent by weight, with the remainder being aluminum.

| Compositions of Typical Aluminum Alloys | | | | | | |
| --- | --- | --- | --- | --- | --- | --- |
| Alloy No. | Si | Cu | Mn | Mg | Cr | Zn |
| 2S | 0.4 | — | — | 0.6 | — | — |
| 3S | — | — | 1.2 | — | — | — |
| 24S | — | 4.5 | 0.6 | 1.5 | — | — |
| 52S | — | — | — | 2.5 | 0.25 | — |
| 61S | 0.6 | 0.25 | — | 1.0 | 0.25 | — |
| 75S | — | 1.60 | — | 2.50 | 0.30 | 5.60 |

These compositions generally include, in addition, small amounts of Fe and Ti and negligible amounts of impurities not shown in the table.

The present invention will be explained in more detail by reference to the following examples, although it is not intended to be limited thereto. Unless otherwise indicated, in the following examples burning-in was always conducted in air. Further, in all examples, unless otherwise indicated, the application rate of the pretreating agent of the present invention was in a dry amount slightly in excess of 10 mg/m$^2$.

EXAMPLE 1

Into 100 parts by weight of ethyleneglycol monomethyl ether were dissolved 2 parts by weight of 1,5-dihydroxynaphthalene naphthoquinone-(1,2)-diazido(2)-5-sulfonic acid ester and 4 parts by weight of novolak type cresol-formaldehyde resin (PR-51245, tradename for product manufactured for by Sumitomo-Durez Co., Ltd. having the formula:

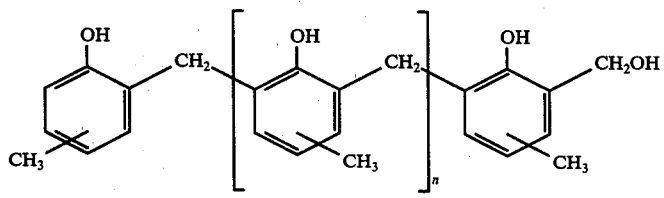

The solution so prepared was coated on a 0.24 mm thick, 1003 × 800 mm sandgrained aluminum plate so as to provide a weight after drying of 2.5 g/m$^2$ and then dried.

The thus obtained positive type light-sensitive planographic printing plate member was brought into intimate contact with a transparent positive and exposed to light with a PS Light (equipped with a 3 KW light source of Toshiba Metal Halide Lamp MU 2000-2-OL and sold by Fuji Photo Film Co., Ltd.) at a distance of 1 m for 30 seconds, and then developed by immersing it in a 5% by weight aqueous solution of sodium silicate for about 1 minute at 25° C. After washing with water, a 4% by weight aqueous solution of potassium borate was coated on the developed printing plate by the use of a sponge and squeezed so as to render the coating as uniform as possible.

The thus processed printing plate was, after drying, heated in Buring Processor 1300 (equipped with a 12 KW heat source and sold by Fuji Photo Film Co., Ltd.) at a temperature of 260° C for 6 minutes.

This printing plate was mounted on an offset printing machine, Multilith 1250 (produced by Addressograph Multigraph Corp.), and printing was conducted. After several sheets were printed, a beautiful print was obtained, and printing was continued, whereby 150,000 copies of beautiful prints were obtained.

COMPARISON EXAMPLE 1

A printing plate was produced in the same manner as in Example 1 except that no burning-in was effected, and mounted on the printing machine. On printing, only 60,000 copies of satisfactory prints were obtained.

COMPARISON EXAMPLE 2

A positive type light-sensitive planographic printing plate member was produced, exposed to light, and developed in the same manner as in Example 1. This member was subjected to the burning-in under the same conditions as used in Example 1 without applying any pre-treatment using potassium borate, and mounted on the offset printing machine, Multilith 1250. From the beginning of printing, ink was transferred even to the non-image areas of the printing plate and thus no satisfactory prints were obtained.

EXAMPLE 2

The same solution of light-sensitive material as was used in Example 1 was coated as in Example 1 on a 0.3 mm thick aluminum plate which had been sand grained and subjected to anodic oxidation at 30° C by passing electricity of a current density of 1.6 amperes/dm$^2$ in 15% by weight sulfuric acid therethrough for 2 minutes, to thereby produce a positive type light-sensitive planographic printing plate member.

This member was brought into intimate contact with a transparent positive and exposed to light by the use of the earlier described PS Light at a distance of 1 m for 40 seconds, and then developed by immersion in a 7% by weight aqueous solution of sodium silicate at 25° C for about 1 minute. After water washing, a 5% by weight aqueous solution of ammonium borate was coated on the above developed printing plate by the use of absorbent cotton and the plate dried.

This printing plate was subjected to the burning-in under the same conditions as used in Example 1, and then mounted on an offset printing machine (Multilith 1250). After several sheets were printed, beautiful prints were obtained, and printing was continued whereby 300,000 copies of beautiful prints were obtained.

COMPARISON EXAMPLE 3

In Example 2, the printing plate member was subjected to a burning-in as described in Japanese Patent Publication No. 27244/1969 without treating with ammonium borate. The member was then immersed in a 3% solution of hydrofluoric acid for about 1 minute and 30 seconds, washed with water, and mounted on an offset printing machine (Multilith 1250) to effect printing. After several sheets were printed, beautiful prints were obtained.

However, the surface of the aluminum support at the non-image areas was gradually subject to abrasion, and when about 200,000 cpies were printed, it lost water retention property and received ink. Thus, it was impossible to continue printing.

EXAMPLE 3

In Example 2, an aqueous solution containing 2% by weight of boric acid and 3% by weight of ammonium borate was used in place of 5% by weight of ammonium borate, and results similar to those of Example 2 were obtained.

EXAMPLE 4

Into 100 parts by weight of ethyleneglycol monomethyl ether were dissolved 4 parts by weight of an ester of polyhydroxyphenyl (condensation product of acetone and pyrogallol) as described in Example 1 of U.S. Pat. No. 3,635,709, and naphthoquinone-1,2-diazido(2)-5sulfonic acid, and 4 parts by weight of the novolak type cresol-formaldehyde resin as was used in Example 1. The resulting solution was coated on the same aluminum plate as was used in Example 2 (which had been subjected to sand graining and anodic oxidation) in a dry weight of 2.5 g/m$^2$ and dried to thereby produce a positive type light-sensitive planographic printing plate member.

This printing plate member, after being exposed to light, developed, and washed with water as in Example 2, was rubbed with a sponge impregnated with a 5 wt% aqueous solution of ammonium borate to uniformly coat the same.

This member was then subjected to a burning-in at 260° C for 6 minutes and mounted on an offset printing machine (Multilith 1250). On printing with an ultraviolet ray curable ink (FLASHDRY produced by Toyo Ink Co., Ltd.), after several sheets were printed, beautiful prints were obtained, and printing was continued, whereby 150,000 beautiful copies were printed.

COMPARISON EXAMPLE 4

In this example, no treatment using ammonium borate was conducted as in Comparison Example 2, and, from the beginning of printing, background contamination occurred and no acceptable prints were obtained.

EXAMPLE 5

A solution was prepared by dissolving 20 parts by weight of the shellac and 3 parts by weight of a diazo resin produced by the condensation reaction of the p-toluenesulfonic acid salt of p-diazophenylamine and formaldehyde in 80 parts by weight of dimethylformamide.

On the other hand, a sand grained aluminum plate was subjected to hydrophilization by immersion in a 0.2% aqueous solution of potassium zirconfluoride at 80° C for 3 minutes, washed with water, and dried. On this aluminum plate was coated the above prepared solution in a dry weight of 2.0 g/m$^2$ and then dried.

The thus obtained negative type light-sensitive planographic printing plate member was exposed to light through a transparent negative by the use of the above PS Light at a distance of 1 m for 30 seconds, and immersed in a 20% by weight aqueous solution of isopropyl alcohol for about 1 minute. Then, on rubbing the surface of the member with absorbent cotton, the unexposed areas alone were completely peeled off and removed, thereby exposing the surface of the support.

After water washing, a 6% by weight aqueous solution of ammonium borate was sprayed on the developed printing plate and coated substantially uniformly thereon with a sponge. After drying, the printing plate was subjected to a burning-in under the same conditions as were used in Example 1 and then mounted on the offset printing machine, (Multilith 1250). After 10 and several sheets were printed, beautiful prints were obtained, and printing was continued, whereby 150,000 copies of prints having substantially the same quality as at the beginning of printing were obtained.

COMPARISON EXAMPLE 5

In this example, no treatment using ammonium borate was conducted, and, as a result, beautiful prints could not be obtained.

While the invention has been described in detail and with reference to specific embodiments thereof, it will be apparent to one skilled in the art that various changes and modifications can be made therein without departing from the spirit and scope thereof.

What is claimed is:

1. A process for producing a planographic printing plate comprising exposing and developing a light-sensitive printing plate; coating the exposed and developed surface of said plate with a solution containing at least one compound selected from the group consisting of boric acid, or the metal salts or ammonium salt thereof; drying said coating and then subjecting said treated plate to a burning-in without removal of said coating composition from said surface whereby printing can be carried out without applying a conventional surface smoothing treatment after the burning-in.

2. The process of claim 1, wherein the light-sensitive planographic plate member comprises a support of aluminum or zinc.

3. The process of claim 1, wherein the solution contains at least one compound selected from the group consisting of boric acid or the metal salts or ammonium salt thereof in a concentration of at least about 0.5 wt. %.

4. The process of claim 1, wherein the burning-in temperature is about 180° C to about 350° C.

5. The process of claim 4, wherein the burning-in temperature is 200° C to 300° C.

6. The process of claim 5, wherein the burning-in is conducted in a period of from 3 to 20 minutes.

7. The process of claim 6, wherein the solution contains at least one compound selected from the group consisting of boric acid, the alkali metal, alkaline earth metal or ammonium salts thereof, in an amount of from 3 to 10 wt%.

8. The process of claim 1 wherein the light-sensitive printing plate comprises an o-quinone diazide type light-sensitive material.

9. The process of claim 1 wherein the light-sensitive printing plate comprises a photosensitive composition selected from the group consisting of diazonium salts, azide compounds and photopolymerizable compounds.

* * * * *